United States Patent
Nakano et al.

(10) Patent No.: US 6,862,895 B2
(45) Date of Patent: Mar. 8, 2005

(54) SEMICONDUCTOR COOLING DEVICE AND METHOD OF CONTROLLING SAME

(75) Inventors: Masao Nakano, Shiga (JP); Hiromasa Ashitani, Shiga (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/400,725

(22) Filed: Mar. 27, 2003

(65) Prior Publication Data

US 2003/0200758 A1 Oct. 30, 2003

(30) Foreign Application Priority Data

Apr. 24, 2002 (JP) ........................................ 2002-121919

(51) Int. Cl.[7] .............................................. F25D 23/12
(52) U.S. Cl. .................... 62/259.2; 62/228.4; 361/711
(58) Field of Search ............................. 62/259.2, 228.4, 62/228.1, 229, 132; 361/699, 700, 711

(56) References Cited

U.S. PATENT DOCUMENTS 6,427,462 B1 * 8/2002 Suenaga et al. ............... 62/185
6,526,768 B2 * 3/2003 Wall et al. ..................... 62/184
6,629,423 B1 * 10/2003 Hirooka et al. ............... 62/208
2003/0062150 A1 * 4/2003 Sweitzer et al. ......... 165/104.33
2003/0126872 A1 * 7/2003 Harano et al. ................. 62/185

FOREIGN PATENT DOCUMENTS

| JP | 63-176956 | 7/1988 |
| JP | 5-315488 | 11/1993 |
| JP | 6-120382 | 4/1994 |

OTHER PUBLICATIONS

Ex parte Masham, Patent and Trademark Office Board of Patent Appeals and Interferences, Decided Feb. 26, 1987, 2USPQ2d, pp. 1647 and 1648.*

* cited by examiner

Primary Examiner—Marc Norman
(74) Attorney, Agent, or Firm—RatnerPrestia

(57) ABSTRACT

A semiconductor cooling device includes at least one cold plate for cooling a semiconductor element, a condenser adapted to be cooled by a fan, and a refrigerant pump. The refrigerant pump is electrically connected to an inverter controller that controls the number of revolutions of the refrigerant pump.

3 Claims, 3 Drawing Sheets

SEMICONDUCTOR COOLING DEVICE AND METHOD OF CONTROLLING SAME

BACKGROUND OF THE INVENTION

1. Field of the Invention

The present invention relates generally to a cooling device for cooling semiconductor elements which generate a substantial quantity of heat and, in particular but not exclusively, to a compact, easy-to-handle and efficient cooling device for cooling such semiconductor elements by utilization of a change in phase between a liquid phase and a vapor phase of a refrigerant.

2. Description of the Related Art

It is well known that some of the semiconductor elements used in, for example, a computer generate a substantial quantity of heat as the computing speed thereof increases. A cooling device including a fan and a heat sink is generally utilized to cool the semiconductor elements. However, the capability of the cooling device to cool the semiconductor elements has now come to a limitation.

In the case of a large-scale computer, Japanese Laid-open Patent Publication No. 5-315488 suggests a method for emergent supply of a refrigerant, but is silent on the control to be effected with the use of an inverter-controlled refrigerant pump. This publication is also silent on the optimum quantity of the refrigerant.

On the other hand, Japanese Laid-open Patent Publication No. 6-120382 suggests a compact cooling device of a heat-pipe type operable by utilization of the phase change of the refrigerant used. This heat-pipe type cooling device would involve an increase in size or insufficient cooling performance particularly when it is used in cooling highly exothermic semiconductor elements.

In any event, the cooling device utilizing the fan and the heat sink is generally widespread in cooling semiconductor elements that emit a relatively small quantity of heat.

The conventional air-cooling device utilizing the fan and the heat sink is effective to cool a semiconductor of about 70 W. However, when it comes to cooling of a semiconductor element of 150 W or higher, the cooling device tends to become too bulky for it to be incorporated within a rack-type frame structure. On the other hand, the system in which the semiconductor elements are immersed in the refrigerant such as disclosed in Japanese Laid-open Patent Publication No. 5-315488 discussed above, has a problem associated with sealability of a vessel for accommodating the semiconductor elements to be cooled and also a problem associated with a storage capability and handing properties because of the cooling device complicated in structure.

Also, since it is directed to mechanical prevention of an increase of the temperature of the semiconductor elements at the time of emergency and cannot therefore be used repeatedly, there has been a problem in that it cannot be used as an optimum control method. In addition, because of lack of availability of a method of controlling a two-phase condition at an outlet of an evaporator, it has been difficult to construct a proper refrigerating cycle. Yet, it is necessary to provide a refrigerant pump of a different cylinder capacity for a cooling device of a different cooling performance and, therefore, it has been required a relatively long period of time to ascertain the reliability.

SUMMARY OF THE INVENTION

The present invention has been developed to overcome the above-described disadvantages.

It is accordingly an objective of the present invention to provide a compact cooling device capable of efficiently cooling highly exothermic semiconductor elements.

Another objective of the present invention is to maintain the highly exothermic semiconductor elements at a temperature lower than an allowable temperature.

A further objective of the present invention is to shorten the length of time required to develop different cooling devices using the identical inverter-controlled refrigerant pump.

In accomplishing the above and other objectives, the semiconductor cooling device according to the present invention includes a cold plate for cooling a semiconductor element, a condenser, and a refrigerant pump, all of which are fluid connected in series with each other to define a refrigerating cycle, and also includes a fan for cooling the condenser and an inverter controller for controlling the number of revolutions of the refrigerant pump.

By this construction, if the number of revolutions of the inverter-controlled refrigerant pump is increased, a high cooling power can be obtained, making it possible to reduce the size of the refrigerant pump. Also, it is possible to reduce the length of time required to develop different cooling devices by employing the identical inverter-controlled refrigerant pump therein.

In a preferred embodiment of the present invention, the refrigerant is filled in the refrigerating cycle in a quantity equal to 65 to 75% of the volume of the refrigerating cycle. This makes it possible for the interior of the condenser to be in a two phase condition involving a high thermal conductivity and for the refrigerating cycle to maximize the performance of the condenser, making it possible to provide a compact cooling device. It is also possible to secure the refrigerating cycle in which no gas-entrapped operation in which the inverter-controlled refrigerant pump entraps a gas as a result of emergence of a vapor refrigerant from an outlet of the condenser takes place.

The present invention also provides a method of controlling a semiconductor cooling device of the structure discussed above. Specifically, in the practice of this method, in the event that a temperature sensor fitted to the cold plate detects that the temperature of the cold plate is higher than a predetermined temperature, the number of revolutions of the refrigerant pump is increased, but in the event that the temperature sensor detects that the temperature of the cold plate is lower than the predetermined temperature, the number of revolutions of the refrigerant pump is decreased. This is particularly advantageous in that the number of revolutions of the inverter-controlled refrigerant pump can be quickly varied in response to the temperature detected by the temperature sensor and, accordingly, the temperature of the cold plate can be optimized quickly.

In a preferred embodiment of the present invention, the number of revolutions of the inverter-controlled refrigerant pump is decreased after the temperature of the cold plate has been stabilized, and the number of revolutions of the inverter-controlled refrigerant pump is increased by 10 to 20% in the event of an abrupt increase of the temperature of the cold plate.

According to this method, it is possible to keep the condition of the refrigerant at the outlet of the cold plate in a 10 to 20% wetted condition and, accordingly, latent heat of the refrigerant can be utilized in response to an abrupt heating of the semiconductor element, making it possible to suppress an abrupt increase of the temperature of the semiconductor element.

BRIEF DESCRIPTION OF THE DRAWINGS

The above and other objectives and features of the present invention will become more apparent from the following description of a preferred embodiment thereof with reference to the accompanying drawings, throughout which like parts are designated by like reference numerals, and wherein.

DETAILED DESCRIPTION OF THE PREFERRED EMBODIMENTS

This application is based on an application No. 2002-121919 filed Apr. 24, 2002 in Japan, the content of which is herein expressly incorporated by reference in its entirety.

Figure 1:
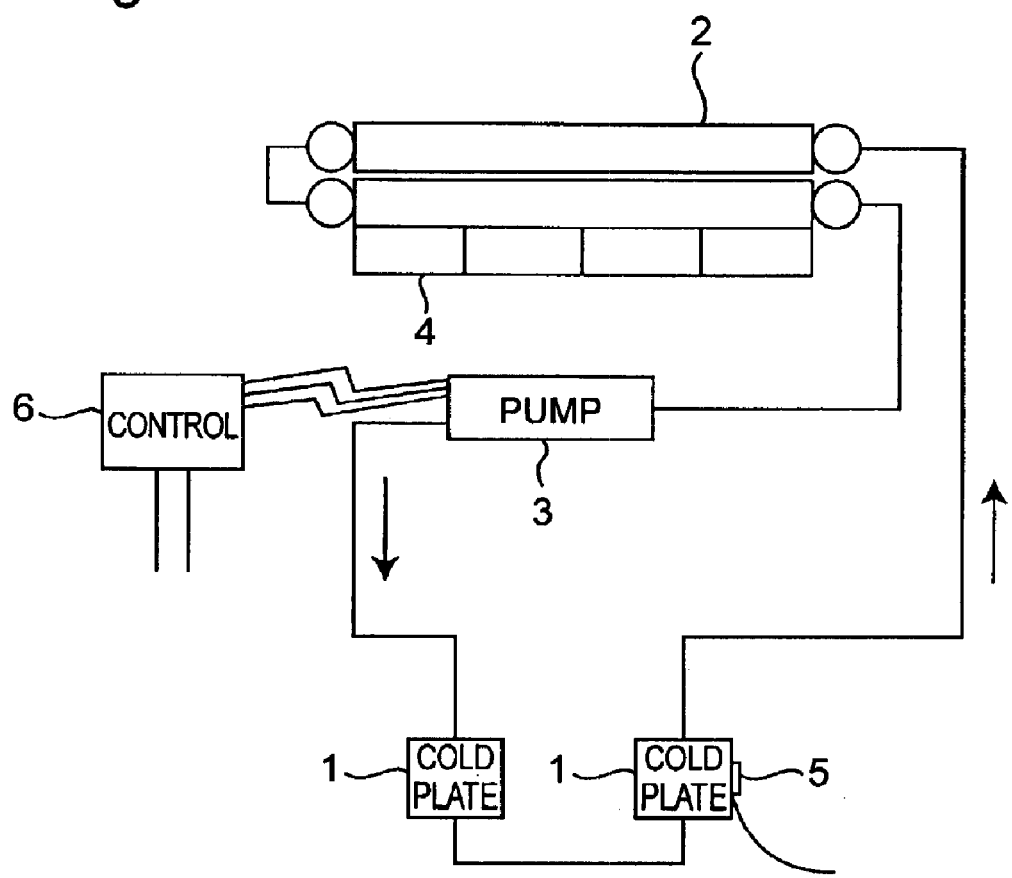
FIG. 1 is a schematic diagram showing a refrigerating cycle used in a cooling device according to a preferred embodiment of the present invention.

Referring first to FIG. 1 showing a refrigerating cycle employed in the present invention, a cooling device includes a plurality of (for example, two) cold plates 1 for cooling highly exothermic semiconductor elements, that is, semiconductor elements tending to emit a substantial amount of heat when in operation, a condenser 2, and an inverter-controlled refrigerant pump 3, all connected in series with each other to define a refrigerating cycle. A refrigerant is filled in this refrigerating cycle. The condenser 2 is adapted to be cooled by a fan 4.

The cooling device is so designed that the refrigerant emerging first from the condenser 2 is supplied towards the cold plates 1 by the refrigerant pump 3. The cold plates 1 so supplied with the refrigerant absorb heat generated by the highly exothermic semiconductor elements and, in the course of absorption of the heat, a change in phase from a liquid refrigerant to a vapor refrigerant takes place within the cold plates 1. The vapor refrigerant is then supplied to the condenser 2 that is then cooled by the fan 4 so that the vapor refrigerant within the condenser 2 undergoes a phase change to a liquid refrigerant.

According to this embodiment, since cooling of the highly exothermic semiconductor elements is carried out by the utilization of the phase change of the refrigerant, a highly efficient cooling can be achieved.

In FIG. 1, reference numeral 5 represents a temperature sensor for detecting the temperature of one of the cold plates 1. This temperature sensor 5 is operable to cause the inverter-controlled refrigerant pump 3 to increase its number of revolutions when the temperature sensor 5 detects an increase of the temperature of the cold plate 1 (when the temperature sensor 5 detects that the temperature of the cold plate 1 is higher than a predetermined temperature), but to cause the inverter-controlled refrigerant pump 3 to decrease its number of revolutions when the temperature sensor 5 detects a decrease of the temperature of the cold plate 1 (when the temperature sensor 5 detects that the temperature of the cold plate 1 is lower than the predetermined temperature). The inverter-controlled refrigerant pump 3 is electrically connected to an inverter controller 6 that supplies the inverter-controlled refrigerant pump 3 with electricity.

Figure 2:
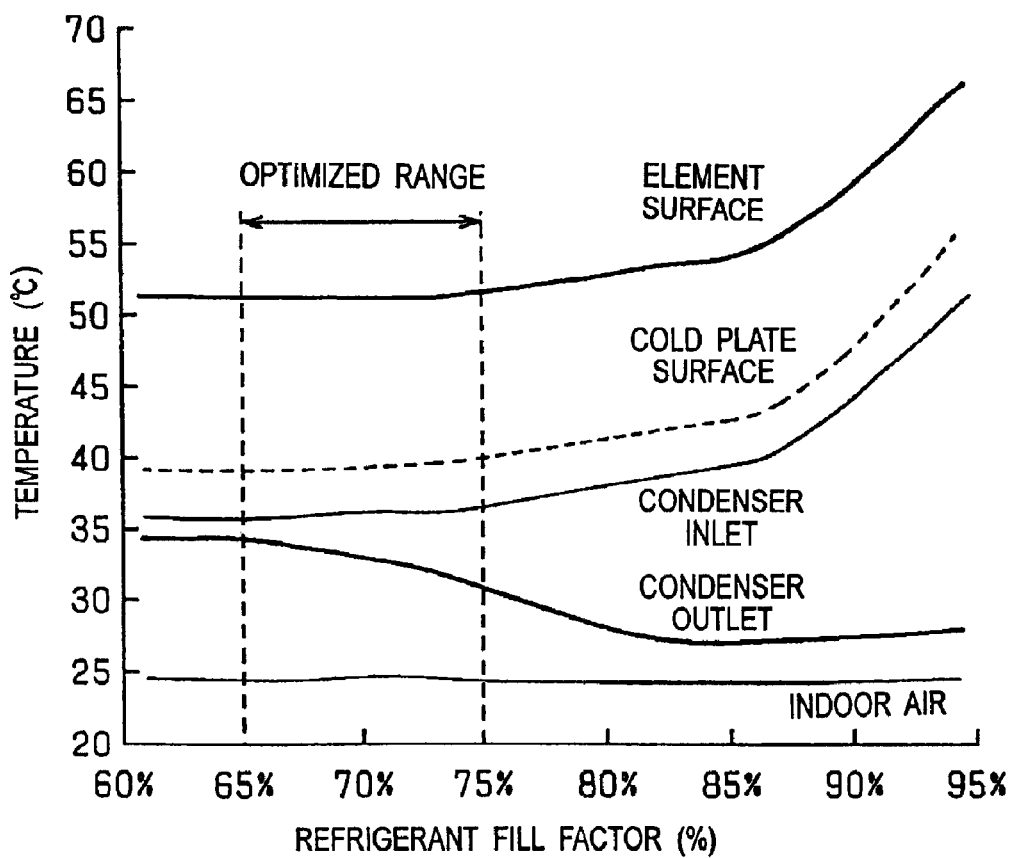
FIG. 2 is a graph showing a relationship between the content volume and the refrigerant fill factor in the refrigerating cycle shown in FIG. 1.

FIG. 2 illustrates a graph showing the relationship between the content volume of the refrigerating cycle and the refrigerant fill factor together with various temperatures measured in the refrigerating cycle. This graph indicates that the surface temperature of the semiconductors, the temperature of the cold plate 1 and the inlet temperature of the condenser 2 all decrease as the refrigerant fill factor decreases, and are generally stabilized at a refrigerant fill factor of about 75%. Also, the difference between the condenser inlet temperature and the condenser outlet temperature (i.e., the subcooling temperature) decreases gradually. If the subcooling temperature diminishes, the vapor refrigerant flows into the inverter-controlled refrigerant pump 3, initiating a gas-entrapped operation and the amount of the refrigerant being circulated is consequently decreased extremely. Once this occurs, the temperature of the cold plates 1 and, hence, that of the semiconductor elements abruptly increases, resulting in a possibility of the semiconductor elements eventually damaged. The limit thereof appears to lie at a refrigerant fill factor of about 65%. So long as the refrigerant fill factor is between 65% and 75%, an efficient heat exchange is available since the refrigerant within the condenser 2 is in two phases made up of the liquid refrigerant and the vapor refrigerant and since the refrigerant under such condition is superior in heat conductivity.

Figure 3:
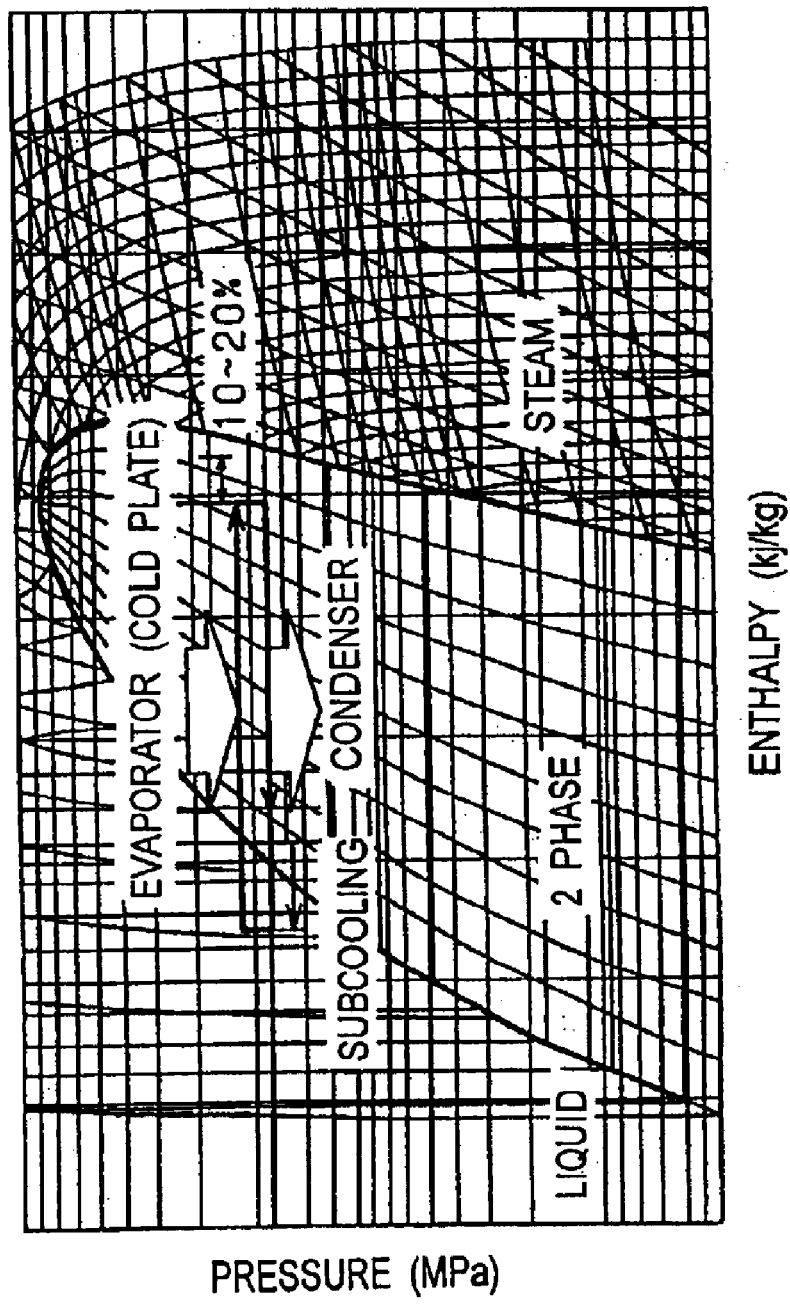
FIG. 3 is a chart showing a P-h diagram of the refrigerant shown together with the refrigerating cycle.

FIG. 3 illustrates a chart comprised of a P-h diagram of the refrigerant shown together with the refrigerating cycle. As can readily be understood from the chart shown in FIG. 3, the condition at the outlet of the cold plates 1 is such that the refrigerant is not in a completely vapor phase, but contains a liquid component in a quantity within the range of 10 to 20%. Accordingly, the liquid component contained in the refrigerant serves to suppress an abrupt increase of the temperature that results from variation in quantity of heat generated by the semiconductor elements. In order to obtain the condition in which the refrigerant contains the liquid component within the range of 10 to 20%, the temperature sensor 5 is fitted to one of the cold plates 1 and a control is performed so as to decrease the number of revolutions of the inverter-controlled refrigerant pump 3 after the temperature of the cold plate 1 has been stabilized, but to increase the number of revolutions of the inverter-controlled refrigerant pump 3 by 10 to 20% in the event of an abrupt increase of the temperature of the cold plate 1.

In other words, with the temperature sensor, it is not possible to keep the condition at the outlet of the cold plate 1 in which the refrigerant contains 10 to 20% liquid component since the temperature is at a constant value under the two phase condition. Accordingly, when the temperature of the cold plate 1 increases abruptly, that is, at 100% vapor refrigerant, the quantity of the refrigerant being recirculated is increased 10 to 20% to make it possible to keep the condition of the refrigerant at the outlet of the cold plate 1 at a 10 to 20% wetted condition. Also, since the subcooling is sufficiently obtained, the refrigerant emerging from the condenser 2 is in the form of a 100% liquid refrigerant and, therefore, the refrigerating cycle is such that there is no possibility of the gas entrapped operation in which gas enters the inverter-controlled refrigerant pump.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be construed as being included therein.

What is claimed is:

1. A semiconductor cooling device comprising:
   a cold plate for cooling a semiconductor element;

a condenser;

a refrigerant pump, said cold plate, condenser and refrigerant pump being fluid connected in series with each other to define a refrigerating cycle;

a fan for cooling the condenser;

an inverter controller for controlling number of revolutions of the refrigerant pump, and refrigerant containing a liquid component at an outlet of the cold plate in a range of 10 to 20%, as controlled by said inverter.

2. A semiconductor cooling device comprising:

a cold plate for cooling a semiconductor element;

a condenser;

a refrigerant pump, said cold plate, condenser and refrigerant pump being fluid connected in series with each other to define a refrigerating cycle;

a fan for cooling the condenser;

an inverter controller for controlling number of revolutions of the refrigerant pump, and refrigerant equal to 65 to 75% of a volume of the refrigerating cycle.

3. A method of controlling a semiconductor cooling device including a cold plate for cooling a semiconductor element, a condenser, and a refrigerant pump, all of which are fluid connected in series with each other to define a refrigerating cycle, and also including a fan for cooling the condenser and a inverter controller for controlling number of revolutions of the refrigerant pump, said method comprising:

decreasing the number of revolutions of the refrigerant pump after the temperature of the cold plate has been stabilized; and increasing the number of revolutions of the refrigerant pump by 10 to 20% in the event of an abrupt increase of the temperature of the cold plate.

* * * * *